(12) United States Patent
Wolleb et al.

(10) Patent No.: US 6,444,807 B1
(45) Date of Patent: Sep. 3, 2002

(54) SUBSTITUTED PHTHALOCYANINE

(75) Inventors: Annemarie Wolleb; Heinz Wolleb, both of Fehren; Gerardus De Keyzer, Riehen, all of (CH); Barbara Wagner, München (DE)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/786,965

(22) PCT Filed: Sep. 9, 1999

(86) PCT No.: PCT/EP99/06653
§ 371 (c)(1), (2), (4) Date: Mar. 12, 2001

(87) PCT Pub. No.: WO00/17275
PCT Pub. Date: Mar. 30, 2000

(30) Foreign Application Priority Data

| Sep. 21, 1998 | (CH) | 1922/98 |
| Dec. 16, 1998 | (EP) | 98811238 |
| Dec. 29, 1998 | (CH) | 2585/98 |
| Feb. 9, 1999 | (EP) | 99810107 |

(51) Int. Cl.[7] .......................................... C07D 487/22
(52) U.S. Cl. ................ 540/131; 540/122; 540/132; 540/133; 540/134; 540/136; 540/137; 540/140
(58) Field of Search ................ 540/122, 131, 540/132, 133, 134, 136, 137, 140

(56) References Cited

U.S. PATENT DOCUMENTS

| 3,972,904 A | 8/1976 | von der Eltz et al. | 260/372 |
| 4,381,261 A | 4/1983 | Bonnet | 260/162 |
| 5,750,758 A | 5/1998 | Zambounis et al. | 558/276 |
| 5,886,160 A | 3/1999 | Hao et al. | 534/733 |

FOREIGN PATENT DOCUMENTS

| WO | 98/14520 | 4/1998 |
| WO | 98/45756 | 10/1998 |
| WO | 98/45757 | 10/1998 |

*Primary Examiner*—Richard L. Raymond
(74) *Attorney, Agent, or Firm*—David R. Crichton

(57) ABSTRACT

The invention relates to phthalocyanine compounds and are represented by the formula:

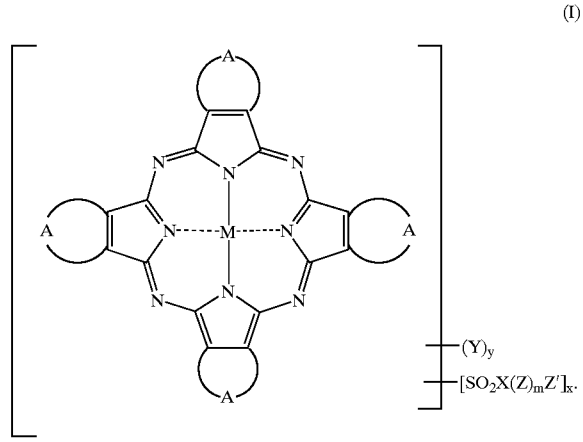

(I)

The compounds are used as a colorant and a pigment precursor, especially in light-sensitive compositions for color filters.

7 Claims, No Drawings

SUBSTITUTED PHTHALOCYANINE

The invention relates to novel phthalocyanine compounds and to their use as colourants.

Phthalocyanines have long been known as colourants, especially as blue pigments, for example C.I Pigment Blue 15 and Pigment Blue 16. By means of substituents, the colour of the parent substance can be influenced within certain limits, substituted products generally being poorly defined mixtures of a large number of components, the composition and colour of which are greatly dependent on the preparation conditions.

Modern technologies, however, demand colourants that are ever better characterised and the shade of which can be produced under a very wide variety of conditions in as reproducible a manner as possible. Such a property is important especially in the case of colourants that are used in a readily soluble latent form and are only thereafter to be converted to the final pigment form.

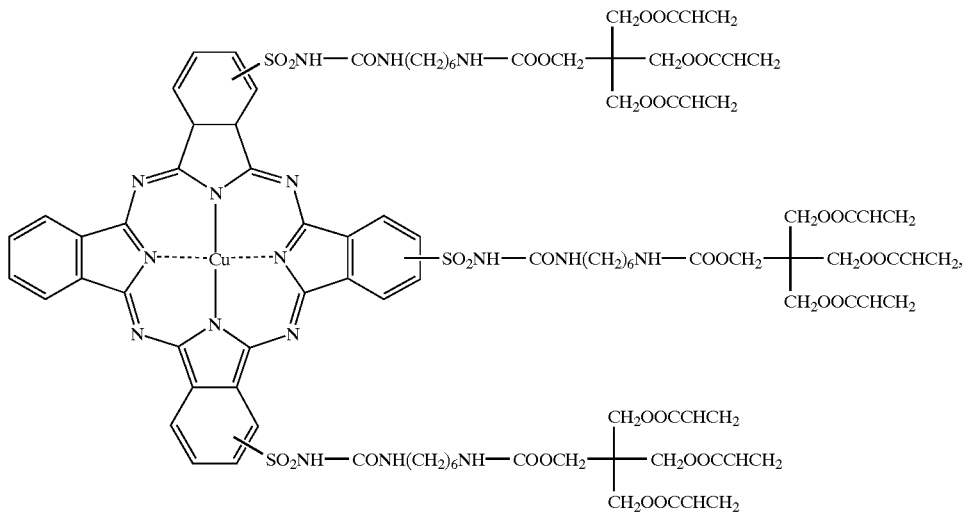

The known substituted phthalocyanines do not, however, adequately meet that demand.

WO98/14520 discloses the selective preparation of formylated and acylated phthalocyanines, as well as products obtainable therefrom.

There are known from EP 648 817 phthalocyanines having alkoxycarbonylamino groups that are bonded to the phthalocyanine nucleus directly or via a $C_1$–$C_4$-1,1-alkylene group or a sulfone group. WO98/32802 discloses various possible applications thereof.

WO98/32802 describes the readily soluble compound of formula

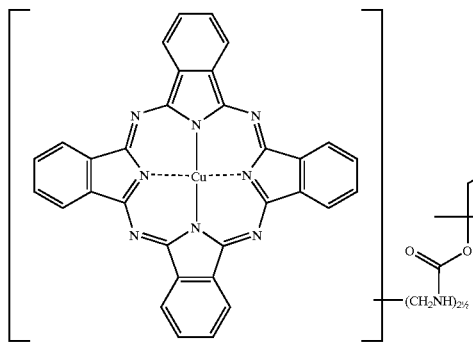

and the thermal decomposition thereof.

Surprisingly, it has been found, however, that such latent phthalocyanines can lead to unexpected difficulties in practical use. In contrast to other latent pigments, thermal decomposition produces undesirable colour shades, and the fastness properties thereof are not sufficiently satisfactory, which poses a problem particularly in the case of high-quality applications, polychromatic systems and, especially, light-sensitive compositions (resists), where high demands and very precise shades must be achieved, for example in colour filters.

U.S. Pat. No. 3,972,904 describes water-soluble textile colourants which cannot, however, be used in conventional high-quality, polychromatic and light-sensitive compositions.

Example 8 of U.S. Pat. No. 4,381,261 describes the preparation of the compound of formula which, however, owing to its high viscosity, cannot be used in conventional high-quality, polychromatic and light-sensitive compositions.

U.S. Pat. No. 4,000,158 describes alcohol- and ketone-soluble phthalocyanine compounds which, since their final solubility in the developer is too high, cannot be used in conventional light-sensitive compositions.

Surprisingly, it has been possible to solve such problems with the compounds according to the invention.

Accordingly, the invention relates to a compound of formula

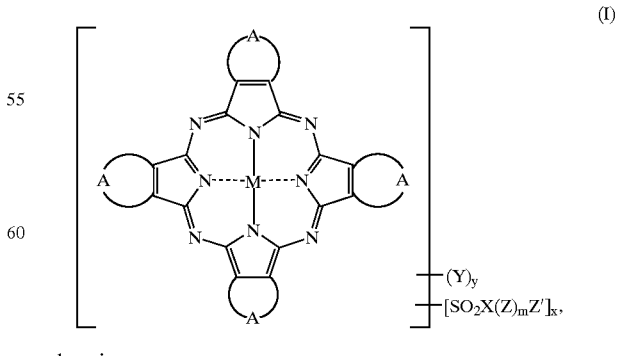

(I)

wherein

M is a divalent metal, oxo metal, halogenometal or hydroxymetal, or 2 hydrogen atoms, A is a radical

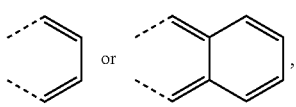

which may be unsubstituted or substituted by phenoxy, naphthyloxy, phenylthio or by naphthylthio, X is a hetero atom selected from the group consisting of N, O and S, m being the number 0 when X is O or S and the number 1 when X is N, Y is any desired substituent that is inert towards alkylating reagents, Z is hydrogen, Z' or COOB, Z' is $C_2$–$C_{12}$alkylene-$N(COOB)_2$, $C_2$–$C_{12}$alkylene-NHCOOB, $C_2$–$C_{12}$alkylene-OCOOB or $C_2$–$C_{12}$alkylene-SCOOB, x is a number from 1 to 4, and y is a number from 0 to 15, wherein the sum of x and y is a maximum of 16 and, optionally, a plurality of radicals X, Y, Z and/or Z' may be identical or different, and B is a group of the formula

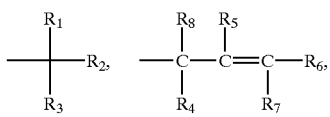

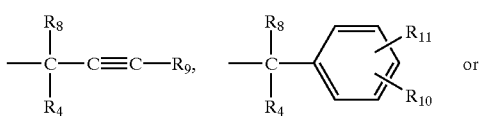

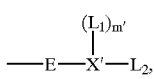

wherein $R_1$ is hydrogen or $C_1$–$C_6$alkyl, $R_2$ and $R_3$ are each independently of the other $C_1$–$C_6$alkyl, $R_4$ and $R_8$ are each independently of the other $C_1$–$C_6$alkyl, $C_1$–$C_6$alkyl interrupted by O, S or by $NR_{12}$, phenyl or biphenyl unsubstituted or substituted by $C_1$–$C_6$alkyl, $C_1$–$C_6$alkoxy, halogen, cyano or by nitro, $R_5$, $R_6$ and $R_7$ are each independently of the others hydrogen or $C_1$–$C_6$alkyl, $R_9$ is hydrogen, $C_1$–$C_6$alkyl or a group of the formula

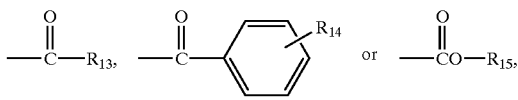

$R_{10}$ and $R_{11}$ are each independently of the other hydrogen, $C_1$–$C_6$alkyl, $C_1$–$C_6$alkoxy, halogen, cyano, nitro, $N(R_{12})_2$, or phenyl unsubstituted or substituted by halogen, cyano, nitro, $C_1$–$C_6$alkyl or by $C_1$–$C_6$alkoxy, $R_{12}$ and $R_{13}$ are each $C_1$–$C_6$alkyl, $R_{14}$ is hydrogen or $C_1$–$C_6$alkyl and $R_{15}$ is $C_1$–$C_6$alkyl, or phenyl unsubstituted or substituted by $C_1$–$C_6$alkyl, E is p,q-$C_2$–$C_6$alkylene unsubstituted or mono- or polysubstituted by $C_1$–$C_6$alkoxy, $C_1$–$C_6$alkylthio or by $C_2$–$C_{12}$dialkylamino, wherein p and q are different position numbers, X' is a hetero atom selected from the group consisting of N, O and S, m' being the number 0 when X' is O or S and the number 1 when X' is N, and $L_1$ and $L_2$ are each independently of the other $C_1$–$C_6$alkyl or [—(p',q'-$C_2$–$C_6$alkylene)—Z"—]$_n$-$C_1$–$C_6$alkyl unsubstituted or mono- or poly-substituted by $C_1$–$C_6$alkoxy, $C_1$–$C_6$alkylthio, $C_2$–$C_{12}$dialkylamino, $C_6$–$C_{12}$aryloxy, $C_6$–$C_{12}$arylthio, $C_7$–$C_{18}$arylalkylamino or by $C_{12}$–$C_{24}$diarylamino, wherein n is a number from 1 to 1000 and p' and q' are different position numbers, each Z" independently of the other(s) is a hetero atom O, S or $C_1$–$C_{12}$alkyl-substituted N, and the $C_2$–$C_6$alkylene radicals in the repeating units [—$C_2$–$C_6$alkylene—Z"—] may be identical or different, and $L_1$ and $L_2$ may be saturated or unsaturated from one to ten times, may be uninterrupted or interrupted at any positions by from 1 to 10 groups selected from the group consisting of —(C=O)— and —$C_6H_4$—, and may carry no further substituents or from 1 to 10 further substituents selected from the group consisting of halogen, cyano and nitro.

$C_2$–$C_{12}$Alkylene is, for example, 1,2-ethylene, 1,2-propylene, 1,3-propylene, 1,2-butylene, 1,3-butylene, 2,3-butylene, 1,4-butylene, 2-methyl-1,2-propylene or an isomer of pentylene, hexylene, octylene, decylene or dodecylene.

$C_6$–$C_{12}$Aryloxy is O—$C_6$–$C_{12}$aryl, for example phenoxy or naphthyloxy, preferably phenoxy.

$C_1$–$C_6$Alkylthio is S—$C_1$–$C_6$alkyl, preferably S—$C_1$–$C_4$alkyl.

$C_6$–$C_{12}$Arylthio is S—$C_6$–$C_{12}$aryl, for example phenylthio or naphthylthio, preferably phenylthio.

$C_2$–$C_{12}$Dialkylamino is N(alkyl$_1$)(alkyl$_2$) wherein the sum of the carbon atoms in the two groups alkyl$_1$ and alkyl$_2$ is from 2 to 12, preferably N($C_1$–$C_4$alkyl)-$C_1$–$C_4$alkyl.

$C_7$–$C_{18}$Alkylarylamino is N(alkyl$_1$)(aryl$_2$) wherein the sum of the carbon atoms in the two groups alkyl$_1$ and aryl$_2$ is from 7 to 18, preferably methylphenylamino or ethylphenylamino.

$C_{12}$–$C_{24}$Diarylamino is N(aryl$_1$)(aryl$_2$) wherein the sum of the carbon atoms in the two groups aryl$_1$ and aryl$_2$ is from 12 to 24, for example diphenylamino or phenylnaphthylamino, preferably diphenylamino.

Substituents that are inert towards alkylating reagents are, for example, those which do not react with pyrocarbonates under the conditions indicated hereinbelow, for example those which do not contain hydroxy, amino or thiol groups.

The substituents $SO_2(Z)_mZ'$ and Y may be located at any aromatic carbon of the radicals A, for example at the peripheral positions of a phthalocyanine or naphthalocyanine and/or optionally at any desired position of the phenoxy, naphthyloxy, phenylthio or naphthylthio substituents.

The compound of formula (I) may especially be a compound of formula

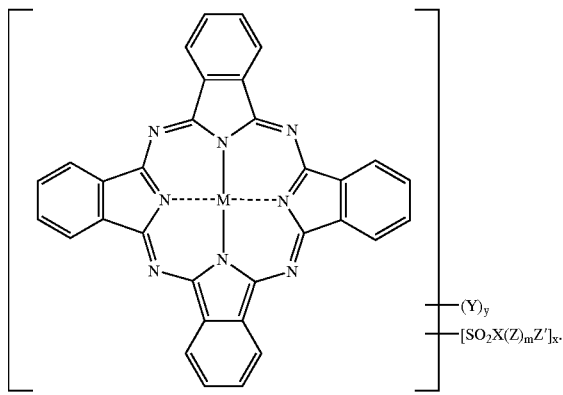

(II)

In a compound of formula (II), the substituents $SO_2(Z)_mZ'$ and Y are advantageously attached at the peripheral positions of the phenyl rings, preferably at the outer positions (2, 3, 9, 10, 16, 17, 23 and/or 24 according to "Nomenklatur von Porphyrinen und Gallenpigmente"[Nomenclature of porphyrins and bile pigments]/May 1989):

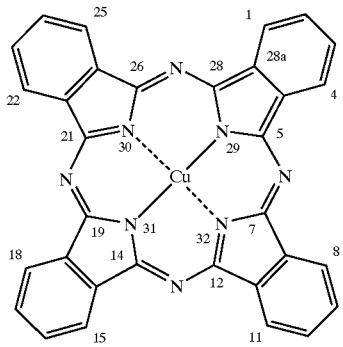

M is preferably Cu, Pd, Pb, Co, Ni, Zn, Mn or V(=O).

A is preferably a radical

X is preferably N or O, especially N.

Y is preferably Cl or Br.

Z is preferably H or COOB, especially COOB.

Z' is preferably $C_2$–$C_{12}$alkylene-NHCOOB or $C_2$–$C_{12}$alkylene-OCOOB, especially $C_2$–$C_{12}$-alkylene-OCOOB.

$C_2$–$C_{12}$Alkylene in Z' is preferably $C_2$–$C_6$alkylene, especially $C_2$–$C_4$alkylene, more especially 1,2-ethylene.

y is preferably 0 or from 4 to 8, especially 0.

The sum of x and y is preferably a maximum of 8.

B is preferably a group of the formula

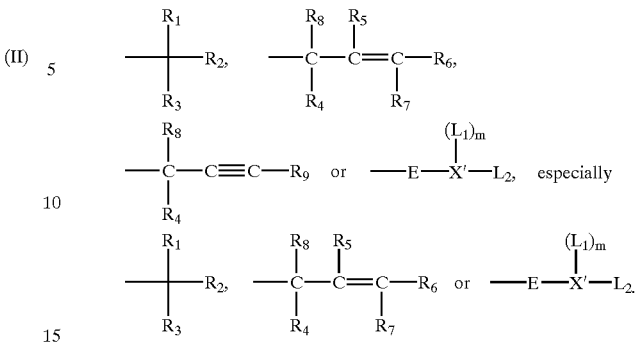

Of the groups B according to the definition, special preference is given to those which are known as preferred groups in other latent pigments, for example the latent pigments of EP 742 255, EP 761 772 or WO98/32802.

$R_1$ is preferably $C_1$–$C_6$alkyl.

The compounds of formula (I) may be prepared analogously to methods known per se, for example starting from known sulfochlorinated phthalocyanines. The sulfochlorinated phthalocyanines themselves may be prepared in a known manner by sulfochlorination of phthalocyanines. They are also obtainable, for example, by cyclisation of 4-sulfo-phthalic acid to phthalocyanine-tetrasulfonic acid and subsequent chlorination with phosphorus pentachloride, as disclosed by K. Sakamoto in Dyes and Pigments 35, 375 (1997) and A. Hong in J. Phys. Chem. 91, 2109 (1987), or by cyclisation of sulfonamido-substituted phthalodinitriles as disclosed in Houben-Weyl E9d, 725 (1998—Georg Thieme Verlag Stuttgart). Mixed syntheses with other phthalodinitriles may optionally also be carried out. The sulfochlorinated phthalocyanines may subsequently be reacted with alcohols, thiols or amines to give the desired sulfonates or sulfonamides.

The compounds of formula (I) are preferably prepared analogously to the methods described, for example, in EP 648 770, EP 648 817, EP 654 711, EP 742 255, EP 761 772 and WO98/32802. To that end, a phthalocyanine of formula (I) wherein Z' is $C_2$–$C_{12}$alkylene-OH, $C_2$–$C_{12}$alkylene-SH or $C_2$–$C_{12}$alkylene-$NH_2$ is reacted with a pyrodicarbonate of the formula

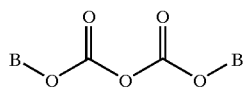

in an aprotic organic solvent in the presence of a base as catalyst, advantageously at temperatures of from 0 to 120° C., preferably from 10 to 100° C., for from 2 to 80 hours.

The molar ratio in a particular case is governed by the number of radicals B to be introduced, the dicarbonate advantageously being employed in excess, based on the theoretically required amount.

Phthalocyanines of formula (I) wherein Z' is $C_2$–$C_{12}$alkylene-OH, $C_2$–$C_{12}$alkylene-SH or $C_2$–$C_{12}$alkylene-$NH_2$ may be prepared from phthalocyanine sulfochlorides analogously to the methods indicated above by reaction with a $C_2$–$C_{12}$alkylene-diol, $C_2$–$C_{12}$alkylene-dithiol, $C_2$–$C_{12}$alkylene-diamine or hydroxy-$C_2$–$C_{12}$alkylene-amine.

The compounds of formula (I) according to the invention are excellently suitable for colouring in the mass high molecular weight organic material.

Examples of suitable high molecular weight organic materials that can be coloured with the compounds of formula (I) according to the invention are vinyl polymers, for example polystyrene, poly-α-methylstyrene, poly-p-methylstyrene, poly-p-hydroxystyrene, poly-p-hydroxyphenylstyrene, poly(methacrylate) and poly(acrylamide) and the corresponding methacrylic compounds, poly(methyl maleate), poly(acrylonitrile), poly(methacrylonitrile), poly(vinyl chloride), poly(vinyl fluoride), poly(vinylidene chloride), poly(vinylidene fluoride), poly(vinyl acetate), poly(methyl vinyl ether) and poly(butyl vinyl ether); novolaks derived from $C_1$–$C_6$aldehydes, for example formaldehyde and acetaldehyde, and a binuclear, preferably mononuclear, phenol that is unsubstituted or is substituted by one or two $C_1$–$C_9$alkyl groups, one or two halogen atoms or by a phenyl ring, for example o-, m- or p-cresol, xylenol, p-tert-butylphenol, o-, m- or p-nonylphenol, p-chlorophenol or p-phenylphenol, or a compound having more than one phenolic group, for example resorcinol, bis(4-hydroxyphenyl)methane or 2,2-bis(4-hydroxyphenyl)propane; polymers derived from maleimide and/or maleic anhydride, for example copolymers of maleic anhydride and styrene; poly(vinylpyrrolidone), biopolymers and derivatives thereof, for example cellulose, starch, chitin, chitosan, gelatin, zein, ethylcellulose, nitrocellulose, cellulose acetate and cellulose butyrate; natural resins and synthetic resins, for example rubber, casein, silicone and silicone resins, ABS, ureaformaldehyde and melamine-formaldehyde resins, alkyd resins, phenolic resins, polyamides, polyimides, polyamide/imides, polysulfones, polyether sulfones, polyphenylene oxides, polyurethanes, polyureas, polycarbonates, polyarylenes, polyarylene sulfides, polyepoxides, polyolefins and polyalkadienes. Preferred high molecular weight organic materials are, for example, cellulose ethers and esters, such as ethylcellulose, nitrocellulose, cellulose acetate or cellulose butyrate, natural resins or synthetic resins, such as polymerisation or condensation resins, such as aminoplasts, especially ureaformaldehyde and melamine-formaldehyde resins, alkyd resins, phenoplasts, polycarbonates, polyolefins, polystyrene, polyvinyl chloride, polyamides, polyurethanes, polyesters, ABS, polyphenylene oxides, rubber, casein, silicone and silicone resins, individually or in the form of mixtures.

The mentioned high molecular weight organic compounds may be present individually or in mixtures as plastic masses, melts or in the form of spinning solutions, surface coating compositions, paints or printing inks. It has proved advantageous to use the compounds of formula (I) as toners or in the form of preparations according to the intended use.

The compounds of formula (I) according to the invention are especially suitable for colouring in the mass polyvinyl chloride and, especially, polyolefins, such as polyethylene and polypropylene, as well as surface-coating compositions, and also powder coatings, printing inks and paints.

Based on the high molecular weight organic material to be coloured, the compounds of formula (I) according to the invention may be used in an amount of from 0.01 to 30% by weight, preferably from 0.1 to 10% by weight.

Colouring of high molecular weight organic substances with the compounds of formula (I) according to the invention is carried out, for example, by mixing the compound of formula (I), optionally in the form of a masterbatch, with the substrates using roll mills or mixing or grinding apparatuses. The coloured material is then brought into the desired final form by methods known per se, such as calendering, compression moulding, extrusion, coating, casting or injection moulding. In order to produce mouldings that are not rigid or to reduce their brittleness, it is often desirable to incorporate so-called plasticisers into the high molecular weight compounds prior to shaping. There may be used as plasticisers, for example, esters of phosphoric acid, phthalic acid or sebacic acid. The plasticisers may be incorporated into the polymers before or after the incorporation of the compounds of formula (I) according to the invention. In order to achieve different colour shades it is furthermore possible to add to the high molecular weight organic substances, in addition to the compound according to the invention, also fillers or other constituents imparting colour, such as white, coloured or black pigments, in any desired amounts.

For colouring surface-coating compositions, paints and printing inks, the high molecular weight organic materials and the compounds of formula (I) according to the invention, optionally together with additives, such as fillers, pigments, siccatives or plasticisers, are finely dispersed or dissolved in a common organic solvent or solvent mixture. That operation may be carried out by dispersing or dissolving the individual components separately, or several components together, and only then combining all the components.

In coloured materials, for example of polyvinyl chloride or polyolefins, or in printing inks, the compounds of formula (I) according to the invention are distinguished by good all-round properties, such as good fastness to migration, light and weathering.

Of very great importance is the conversion of compounds according to the invention incorporated in a substrate to the corresponding compounds of formula (I) wherein Z' is $C_2$–$C_{12}$alkylene-OH, $C_2$–$C_{12}$alkylene-SH or $C_2$–$C_{12}$alkylene-NH$_2$. The conversion may be achieved in the simplest manner by heat treatment (heating to temperatures of from 50 to 250° C., preferably from 100 to 200° C.), in organic or aqueous media, polymer solutions or melts, of the solids, solutions or dispersions comprising the compounds according to the invention. In many cases, the desired conversion can be achieved merely as a result of the conventional conditions of incorporation.

That permits the colouring of surface-coating compositions, printing inks, plastics, especially also in fibre form, heat-sensitive recording systems, inks for ink-jet printing, toners for electrophotographic recording processes, coloured ribbons for thermal transfer printing onto smooth or woven receiver substrates, and, more especially, also in light-sensitive compositions, for example negative or positive resist formulations, with overall improved properties, such as purity, colour shade, colour strength, brilliance, transparency and fastness properties, and also valuable applications in analysis.

Accordingly, the invention relates also to a high molecular weight organic material comprising in the mass thereof a colourant of formula (I) wherein Z' is $C_2$–$C_{12}$alkylene-OH, $C_2$–$C_{12}$alkylene-SH or $C_2$–$C_{12}$alkylene-NH$_2$, produced in situ by thermal degradation of a compound of formula (I), as well as to a heat-, photo- or chemo-sensitive recording material, an ink for ink-jet printing, a toner for electrophotographic recording processes, a coloured ribbon for thermal transfer printing or a light-sensitive negative or positive resist composition that comprises a compound of formula (I).

Inks for ink-jet printing, toners for electrophotographic recording processes, coloured ribbons for thermal transfer printing, heat-, photo- and chemo-sensitive recording materials and light-sensitive negative or positive resist compositions are very well known to the person skilled in the art.

A very special, surprising advantage of the compounds according to the invention is that thermal conversion thereof yields products of a colour that corresponds to the colour shade cyan (blue-green), which is desirable for optical applications but has not been achieved hitherto using phthalocyanines. Thermal decomposition of the compounds according to the invention also yields products of a higher degree of purity than in the case of the compounds used hitherto.

By virtue of such improved properties, the soluble colourants of formula (I) according to the invention can be used especially advantageously in compositions that are used for the production of structured colour images or colour filters. The use of soluble pigment precursors in the production of structured colour images or colour filters is known from EP 654 711. Those compositions comprise, for example, in addition to the colourant, a positive or negative resist. Resist formulations comprising colourants of formula (I) can be irradiated in the desired pattern and developed, it being possible for the thermal conversion to colourants of formula (I) wherein Z' is $C_2$–$C_{12}$alkylene-OH, $C_2$–$C_{12}$alkylene-SH or $C_2$–$C_{12}$alkylene-NH$_2$ to take place at the time of the exposure or development or, alternatively, not until later. The compounds of formula (I) may also be applied in the desired pattern directly onto a receiver layer suitable for that purpose by means of ink-jet printing or thermally induced diffusion. The methods disclosed in EP 654 711 are highly suitable for the production of colour filters.

Accordingly, the invention relates also to a method of producing structured colour images or colour filters, which method comprises the pattern-wise irradiation, development and heat treatment of a positive or negative resist comprising a colourant of formula (I), wherein the heat treatment may take place at the time of the irradiation or development or later and the thermal conversion yields a colourant of formula (I) wherein Z' is $C_2$–$C_{12}$alkylene-OH, $C_2$–$C_{12}$alkylene-SH or $C_2$–$C_{12}$alkylene-NH$_2$.

The Examples which follow illustrate the invention without limiting the scope thereof (unless indicated to the contrary, "%" is always % by weight):

EXAMPLE A1

In a 2.5 liter flask equipped with a KPG stirrer, a reflux condenser, an internal thermometer, a dropping funnel and a nitrogen inlet, 86.5 mmol of freshly prepared copper phthalocyanine tetrakis-sulfochloride (prepared according to Example 1 of WO98/45756, containing 30% copper phthalocyanine tris-sulfochloride) are dissolved in one liter of tetrahydrofuran (THF). 63.4 g of ethanolamine in 100 ml of THF at 10° C. are added dropwise to the resulting blue solution. The blue suspension is stirred for 3 hours and then refluxed for 17 hours, following which the solvent is concentrated in vacuo at 50° C. using a rotary evaporator. The residue is suspended in one liter of dilute hydrochloric acid (1M) and stirred for 30 minutes. The suspension is then filtered, washed with 750 ml of water and dried overnight at 50° C./160 mbar. 77 g of a blue powder are obtained.

| Elemental analysis [%]: | ($C_{39.4}H_{34.5}N_{11.7}O_{11.1}S_{3.7}Cu \cdot 1.3\ H_2O$) | | | |
| --- | --- | --- | --- | --- |
| theory: | C 44.85 | H 3.54 | N 15.53 | S 11.25 |
| found: | C 45.10 | H 3.83 | N 15.46 | S 11.23 |

If the process indicated in Example 1 of WO98/45756 is used, but less chlorosulfonic acid is employed, then mixtures of compounds having different numbers of sulfo groups are readily obtained, from which, if desired, the compounds having from 1 to 3 sulfo groups can be isolated by conventional methods of separation. Such homologues or homologue mixtures can be used as starting material instead of copper phthalocyanine tetrakis-sulfochloride with comparable results.

EXAMPLE A2

In a one liter flask equipped with a KPG stirrer, an internal thermometer, a dropping funnel and a nitrogen inlet, 83.4 g of ethylenediamine are dissolved in 100 ml of THF. 17.36 mmol of freshly prepared copper phthalocyanine tetrakis-sulfochloride (prepared according to Example 1 of WO98/45756, containing 30% copper phthalocyanine tris-sulfochloride), dissolved in 280 ml of THF, are added dropwise to the yellowish solution at an internal temperature of from 20 to 25° C. The reaction mixture is stirred for 2½ hours. The solvent is then distilled off in vacuo at 50° C. using a rotary evaporator. 700 ml of acetone are added to the thick, blue-green suspension, and stirring is carried out for 15 minutes followed by filtration and washing with acetone until the filtrate is colourless. The filter cake is dried at 50° C./160 mbar, yielding 7 g of a blue powder.

| Elemental anaylsis [%]: | ($C_{39.4}H_{38.2}N_{15.4}O_{7.4}S_{3.7}Cu \cdot 6\ H_2O$) | | | |
| --- | --- | --- | --- | --- |
| theory: | C 41.65 | H 4.45 | N 18.99 | S 10.44 |
| found: | C 42.26 | H 4.62 | N 18.11 | S 9.84 |

EXAMPLE A3

In a one liter flask equipped with a KPG stirrer, an internal thermometer, a dropping funnel and a nitrogen inlet, 122.5 g of 1,4-diamino-butane are dissolved in 100 ml of THF. 17.36 mmol of freshly prepared copper phthalocyanine tetrakis-sulfochloride (prepared according to Example 1 of WO98/45756, containing 30% copper phthalocyanine tris-sulfochloride), dissolved in 280 ml of THF, are added dropwise to the solution at an internal temperature of from 20 to 25° C. The reaction mixture is stirred for 2½ hours. The solvent is then distilled off in vacuo at 50° C. using a rotary evaporator. 700 ml of acetone are added to the blue, oily residue, and stirring is carried out for 15 minutes followed by filtration and washing with acetone until the filtrate is colourless. The filter cake is dried at 50° C./160 mbar, yielding 8.5 g of a blue powder.

| Elemental analysis [%]: | ($C_{46.8}H_{53}N_{15.4}O_{7.4}S_{3.7}Cu \cdot 5\ H_2O$) | | | |
| --- | --- | --- | --- | --- |
| theory: | C 45.92 | H 5.21 | N 17.66 | S 9.78 |
| found: | C 46.25 | H 4.78 | N 16.45 | S 9.61 |

EXAMPLE A4

103.43 g (0.89 mol) of 1,6-diamino-hexane in 300 ml of THF are introduced into a one liter flask equipped with a KPG stirrer, an internal thermometer, a dropping funnel and a nitrogen inlet. 11.12 mmol of freshly prepared copper phthalocyanine tetrakis-sulfochloride (prepared according to Example 1 of WO98/45756, containing 30% copper phthalocyanine tris-sulfochloride), dissolved in 100 ml of THF, are added dropwise to the suspension at an internal temperature of from 20 to 25° C. The reaction mixture is stirred for 1½ hours. The solvent is then distilled off in vacuo at 50° C. using a rotary evaporator. 700 ml of acetone are added to the blue, pasty residue, and stirring is carried out for 15 minutes followed by filtration and washing with acetone until the filtrate is colourless. The filter cake is dried at 50° C./160 mbar, yielding 2.3 g of a blue powder.

| Elemental analysis [%]: | ($C_{54.2}H_{67.8}N_{15.4}O_{7.4}S_{3.7}Cu \cdot 6\ H_2O$) | | | |
|---|---|---|---|---|
| theory: | C 48.45 | H 5.99 | N 16.05 | S 8.83 |
| found: | C 47.94 | H 5.91 | N 15.29 | S 9.49 |

EXAMPLE A5

12.3 g of 4-sulfo-phthalic acid, 4.0 g of copper(II) chloride, 1.0 g of 1,8-diazabicyclo[5.4.0]undec-7-ene (DBU) and 30 g of urea in 150 ml of trichlorobenzene are introduced into a 250 ml multi-necked flask equipped with a reflux condenser, an internal thermometer, a nitrogen inlet, a KPG stirrer and a heating mantle. The reaction solution is heated slowly to 210° C. and then refluxed for 3 hours. The blue suspension is cooled to 23° C., filtered and washed with 400 ml of toluene. The filter cake is dried at 60° C./160 mbar, and 65.1 g of phosphorus pentachloride are immediately added thereto under argon; heating to 150° C. is carried out followed by stirring at that temperature for 24 hours. Excess phosphorus pentachloride is then distilled off in vacuo by means of a distillation apparatus at a bath temperature of 120° C. and a head temperature of 55° C., the collecting vessel being cooled with dry ice. 500 ml of water are added to the distillation residue, and filtration is carried out followed by washing with 500 ml of water. The filter cake is suspended in 130 ml of THF in a 500 ml flask equipped with a reflux condenser, a dropping funnel, an internal thermometer, a nitrogen inlet and a KPG stirrer, and a solution of 9.2 g of ethanolamine in 30 ml of THF is added dropwise. The thick suspension is diluted with a further 100 ml of THF, heated to reflux and stirred for 20 hours. The blue suspension is then cooled to 23° C. and the solvent is decanted off. 200 ml of water are added to the residue, and stirring is carried out for 30 minutes. The suspension is filtered, washed with 200 ml of water and dried at 50° C./160 mbar, yielding 6.3 g of a blue powder.

EXAMPLE A6

105 ml of chlorosulfonic acid are added dropwise to 25.0 g of copper phthalocyanine, the temperature being maintained at a maximum of 50° C. by cooling with an ice bath. Heating to 145° C. is then carried out in the course of 45 minutes. After 3½ hours, cooling to 80° C. is carried out, and then a total of 32.5 ml of thionyl chloride is added in portions in the course of 25 minutes. After 3½ hours at from 80 to 85° C. and 16 hours at 23° C., the reaction mixture is discharged into 4 liters of ice-water. The precipitated product is filtered off, washed with 4 liters of ice-water and air-dried for 30 minutes.

The resulting blue paste is dissolved in 200 ml of tetrahydrofuran. A solution of 60 ml of ethanolamine in 200 ml of tetrahydrofuran is added dropwise in the course of 45 minutes while cooling at 30° C. The reaction mixture is then heated at reflux for 16 hours, cooled to 23° C. and concentrated by evaporation under reduced pressure. After the addition of 1.5 liters of dilute hydrochloric acid (0.5M), the precipitate is filtered off, washed with 0.5 liter of dilute hydrochloric acid and concentrated by evaporation at 95° C./130 mbar. 42.0 g of the desired pigment are obtained.

| Analysis [%]: ($C_{40}H_{36}N_{12}O_{12}S_4Cu.4H_2O$) | | | | | |
|---|---|---|---|---|---|
| theory | C 43.18 | H 3.70 | N 15.11 | S 11.53 | Cu 5.71 $H_2O$ 4.00 |
| found | C 43.38 | H 3.64 | N 14.65 | S 10.99 | Cu 5.65 $H_2O$ 3.96 |

EXAMPLE A7

A procedure analogous to Example A6 is followed, but cobalt phthalocyanine is used instead of copper phthalocyanine.

EXAMPLE A8

A procedure analogous to Example A6 is followed, but zinc phthalocyanine is used instead of copper phthalocyanine.

EXAMPLE A9

A procedure analogous to Example A6 is followed, but copper naphthalocyanine is used instead of copper phthalocyanine.

EXAMPLE A10

A procedure analogous to Example A6 is followed, but a pentakis-chloro-copper phthalocyanine isomeric mixture is used instead of copper phthalocyanine.

EXAMPLE A11

A procedure analogous to Example A5 is followed, but 3-phenoxy-phthalic acid is used instead of 4-sulfo-phthalic acid. UV/VIS ($CH_2Cl_2$): $\lambda_{max}$=723 nm.

EXAMPLE A12

A procedure analogous to Example A10 is followed, but 3-(β-naphthyloxy)phthalic acid is used instead of 3-phenoxy-phthalic acid. UV/VIS ($CH_2Cl_2$). $\lambda_{max}$=715 nm.

EXAMPLE A13

A procedure analogous to Example A11 is followed, but 3-phenylthio-phthalic acid is used instead of 3-phenoxy-phthalic acid.

EXAMPLE A14

A procedure analogous to Example A12 is followed, but 3-(β-naphthylthio)phthalic acid is used instead of 3-(β-naphthyloxy)-phthalic acid.

EXAMPLE B1

154 g of the compound of Example A1 in 1.5 liters of THF are introduced into a 2.5 liter flask equipped with a dropping funnel and a nitrogen inlet and stirred for 19 hours by means of a KPG stirrer. 23 g of 60% sodium hydride are then added in portions, and stirring is carried out for a further 24 hours at 23° C. 314.52 g of di-tert-butyl dicarbonate in 300 ml of THF are then added dropwise and the suspension is stirred for 24 hours at 23° C. The solution is left to stand for 65 hours. The reaction mixture is then filtered through a cloth filter and the filtrate is concentrated in vacuo at 40° C. using a rotary evaporator. The blue, pasty residue is made into a slurry in one liter of hexane, the slurry is filtered, and the residue is washed with hexane. The powdered filter cake is taken up in THF and filtered over silica gel using THF as eluant. The filtrate is concentrated in vacuo at 40° C., yielding 63 g of a moist blue solid, which is suspended in 500 ml of hexane. The suspension is filtered again, washed with hexane and dried overnight at 23° C./160 mbar. 40 g of a blue powder are obtained.

| | Elemental analysis [%] | | | | | |
|---|---|---|---|---|---|---|
| theory: | C 49.06 | H 4.67 | N 11.44 | S 8.73 | O 21.78 | Cu 4.33 |
| found: | C 49.57 | H 4.90 | N 11.62 | S 8.19 | O 21.02 | Cu 5.02 |

TGA (rate of heating 10° C./min.): point of inflection of the decomposition=160° C.; the product according to Example A1 re-forms.

UV/VIS (NMP): $\lambda_{max}$=672 nm, $\epsilon$=178 544.

EXAMPLE B2

7 g of the compound of Example A2 in 100 ml of THF are introduced, under argon, into a 250 ml multi-necked flask and stirred for 24 hours. 0.32 g of N,N-dimethyl-4-aminopyridine (DMAP) and, after a further 5 hours, 17.2 g of di-tert-butyl dicarbonate are then added. The suspension is stirred for 21 hours at 23° C. It is then filtered over Celite and washed with THF, and the filtrate is concentrated in vacuo at 40° C. The blue residue is dissolved in 30 ml of dichloromethane; 15 ml of diethyl ether are added and the mixture is added dropwise to 300 ml of hexane, following which the resulting suspension is filtered and washed with hexane. The blue filter cake is dissolved in THF and filtered through silica gel using THF as eluant. The solvent is distilled off in vacuo at 40° C. using a rotary evaporator. The blue residue is suspended in hexane, filtered and dried overnight at 23° C./160 mbar. 2.8 g of a blue powder are obtained.

TGA (rate of heating 10° C./min.): point of inflection of the decomposition=166° C.; the product according to Example A2 re-forms.

UV/VIS (NMP): $\lambda_{max}$=673 nm, $\epsilon$=88 634.

EXAMPLE B3

8.5 g of the compound of Example A3 in 110 ml of THF are introduced, under argon, into a 250 ml multi-necked flask and stirred for 24 hours. 0.35 g of DMAP and, after a further 5 hours, 18.9 g of di-tert-butyl dicarbonate are then added. The suspension is stirred for 19 hours at 23° C. It is then filtered over Celite and washed with THF, and the filtrate is concentrated in vacuo at 40° C. The blue residue is dissolved in THF and filtered through silica gel using THF as eluant. The solvent is distilled off in vacuo at 40° C. using a rotary evaporator. The blue residue is dissolved in 15 ml of dichloromethane; 7 ml of diethyl ether are added and the mixture is added dropwise to 200 ml of hexane, following which the resulting suspension is filtered and washed with hexane. The filter cake is dried at 23° C./160 mbar. 1.3 g of a blue powder are obtained.

TGA (rate of heating 10° C./min.): point of inflection of the decomposition=166° C.; the product according to Example A3 re-forms.

UV/VIS (NMP): $\lambda_{max}$=673 nm, $\epsilon$=89 510.

EXAMPLE B4

2.2 g of the compound of Example A4 in 30 ml of THF are introduced, under argon, into a 250 ml multi-necked flask and stirred for 8 hours. 83 mg of DMAP and 4.47 g of di-tert-butyl dicarbonate are then added. The suspension is stirred for 17 hours. It is then filtered through silica gel using THF as eluant, and the solvent is distilled off in vacuo at 40° C. using a rotary evaporator. The blue residue is suspended in 200 ml of hexane, filtered, washed with hexane and dried overnight at 23° C./160 mbar. Since TGA indicates an impure substance, the blue powder is taken up in 3 ml of dichloromethane; 1.5 ml of diethyl ether are added and the mixture is added dropwise to 30 ml of hexane. Filtration is then carried out followed by drying at 23° C./160 mbar. 0.4 g of a blue powder is obtained.

| Elemental analysis [%]: | theory: C 54.03 H 6.20 N 13.26 S 7.59 |
| --- | --- |
| | found: C 53.08 H 5.77 N 12.25 S 7.38 |

TGA (rate of heating 10° C./min.): point of inflection of the decomposition=168° C.; the product according to Example A4 re-forms.

UV/VIS (NMP): $\lambda_{max}$=672 nm, $\epsilon$=98 871.

EXAMPLE B5

20.0 g of the compound of Example A6 are suspended in 2.7 g of dimethylaminopyridine, 500 ml of tetrahydrofuran and 40 ml of pyridine, with vigorous stirring, in a 1.5 liter reaction vessel equipped with a stirrer, a thermometer and a nitrogen inlet. 41.0 g of di-tert-butyl pyrocarbonate are added at 23° C. The reaction mixture is stirred for a further 20 hours and then concentrated at 23° C./200 mbar to a volume of approximately 50 ml. A dark blue precipitate is formed by the addition of one liter of n-hexane, which precipitate is filtered off and washed thoroughly with a total of one liter of n-hexane in portions. The filtration residue is dissolved in 600 ml of tetrahydrofuran. The solution is filtered through 50 g of silica gel, the silica gel subsequently being rinsed with 500 ml of tetrahydrofuran. After concentration of the filtrate at 23° C./200 mbar, the residue is taken up in 500 ml of n-hexane and filtered off. The residue is filtered off, washed with n-hexane and dried at 23° C./200 mbar. There are obtained 26.6 g of a pure, cobalt-blue powder assumed to have the formula:

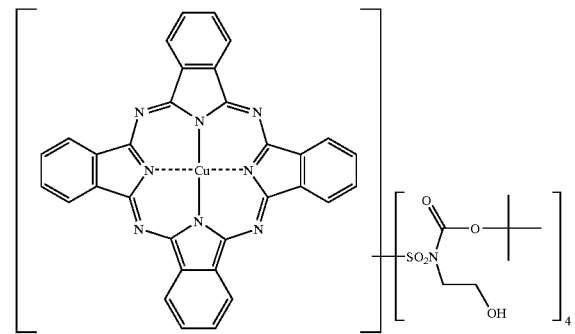

EXAMPLE B6

Analogously to Example B5 there is obtained from the product according to Example A7 the product having the following structure:

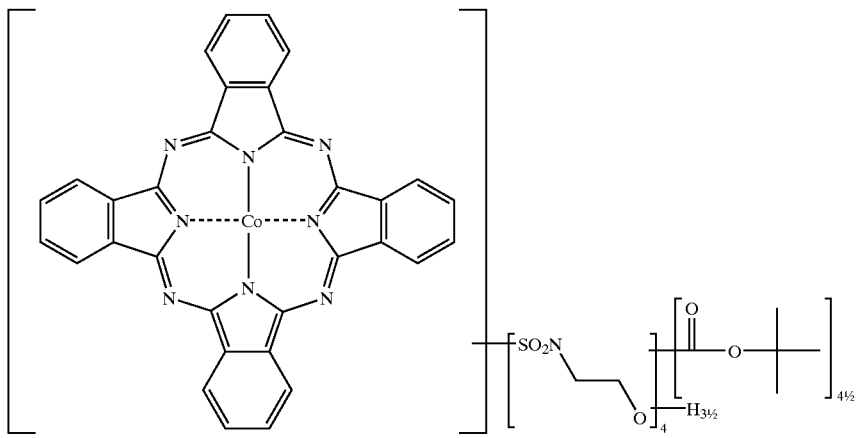

| Analysis [%]: | | | | ($C_{65}H_{76}N_{12}O_{22}S_4Co$) |
|---|---|---|---|---|
| theory | C 49.90 | H 4.90 | N 10.74 | S 8.20 | Co 3.77 |
| found | C 49.08 | H 4.66 | N 11.20 | S 6.86 | Co 3.39 |

Thermogravimetric analysis (0–400° C. 10° C./min.):

| theory | weight loss | 32.0% | |
|---|---|---|---|
| found | weight loss | 30.1% | (max. at 158° C.) |

EXAMPLE B7

Analogously to Example B5 there is obtained in good yield from the product according to Example A9 the product having the following structure:

Thermogravimetric analysis (0–400° C., 10° C./min.): maximum at 159° C.

EXAMPLE B8

0.66 g of 4-dimethylaminopyridine and 11.4 g of di-tert-butyl pyrocarbonate are added to a suspension of 5.0 g of the compound of Example A6 in 140 ml of tetrahydrofuran; the reaction mixture is stirred for 16 hours at 23° C. and filtered over 40 g of Hyflo Super-Cel® and then over 140 g of silica gel. After washing the filter with 600 ml of tetrahydrofuran, the solution is concentrated by evaporation under reduced pressure. The product is precipitated with 500 ml of n-hexane, filtered off, washed with n-hexane and dried at 20° C./130 mbar. There are obtained 7.4 g of a blue powder having the following structure:

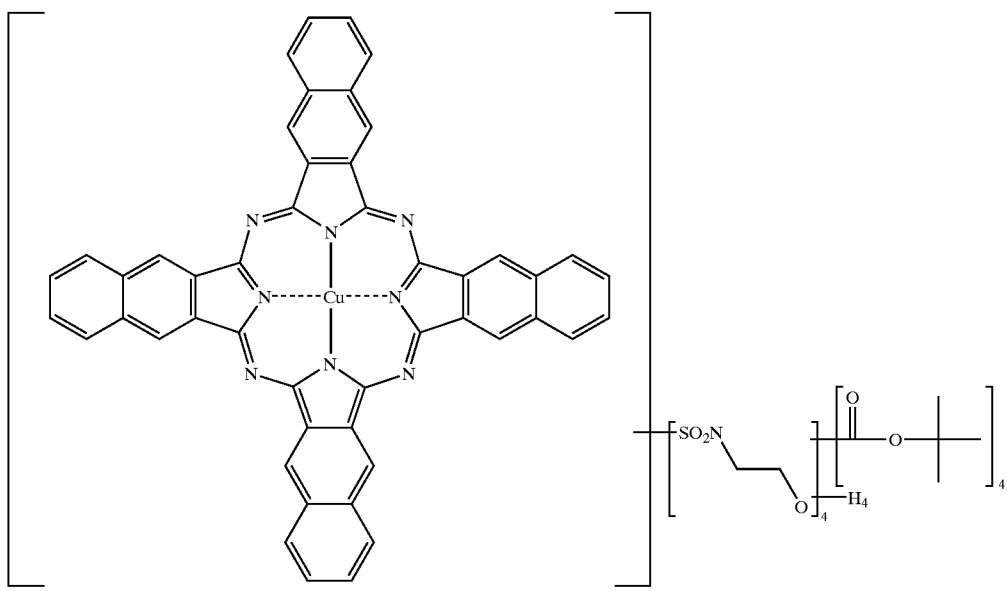

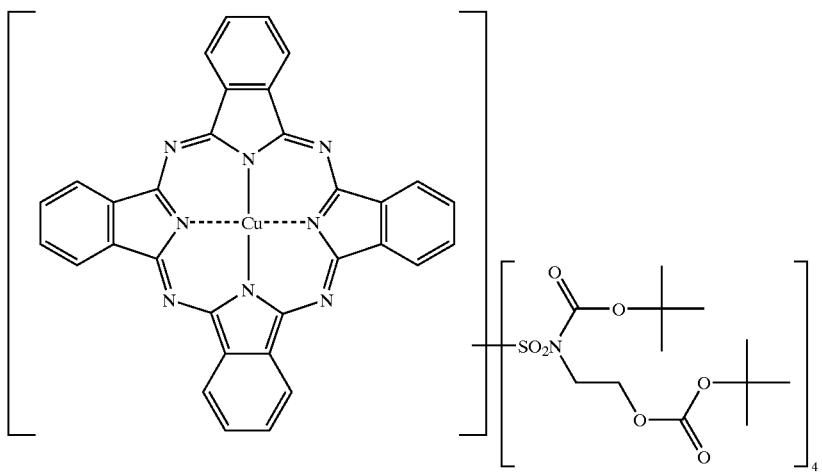

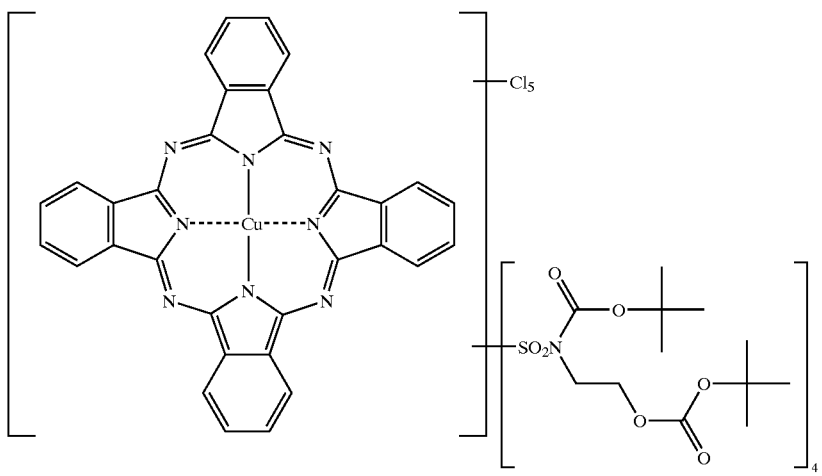

EXAMPLE B9

Analogously to Example B8 there is obtained in quantitative yield from the product according to Example A10 the product having the following structure:

| Analysis [%]: | | | | ($C_{80}H_{100}N_{12}O_{28}S_4Cu \cdot 0.5\ H_2O$) | | |
|---|---|---|---|---|---|---|
| theory | C 51.15 | H 5.42 | N 8.95 | S 6.83 | Cu 3.38 | $H_2O$ 0.48 |
| found | C 50.92 | H 5.04 | N 9.66 | S 7.00 | Cu 3.59 | $H_2O$ 0.48. |

UV/VIS ($CH_2Cl_2$): $\lambda_{max}$ = 672 nm ($\epsilon$ = 140 500).
Thermogravimetric analysis (0–400° C., 10° C./min.):

| theory | weight loss | 42.8% | |
|---|---|---|---|
| found | weight loss | 42.1% | (max. at 177° C.) |

UV/VIS ($CH_2Cl_2$): $\lambda_{max}$=676 nm ($\epsilon$=75 363).

Thermogravimetric analysis (0–400° C., 10° C./min.): maximum at 168° C.

EXAMPLE B10

Analogously to Example B8 there is obtained from the product according to Example A11 the product having the following structure (isomeric mixture):

| Analysis [%]: ($C_{79.4}H_{100.5}Cl_5N_{15.4}O_{29.1}S_{3.7}Cu \cdot 1.6H_2O$) | | | | | | | |
|---|---|---|---|---|---|---|---|
| theory | C 44.89 | H 4.92 | N 10.15 | S 5.58 | Cu 2.99 | Cl 8.34 | $H_2O$ 1.6 |
| found | C 45.61 | H 4.58 | N 10.29 | S 6.72 | Cu 3.15 | Cl 9.14 | $H_2O$ 1.6 |

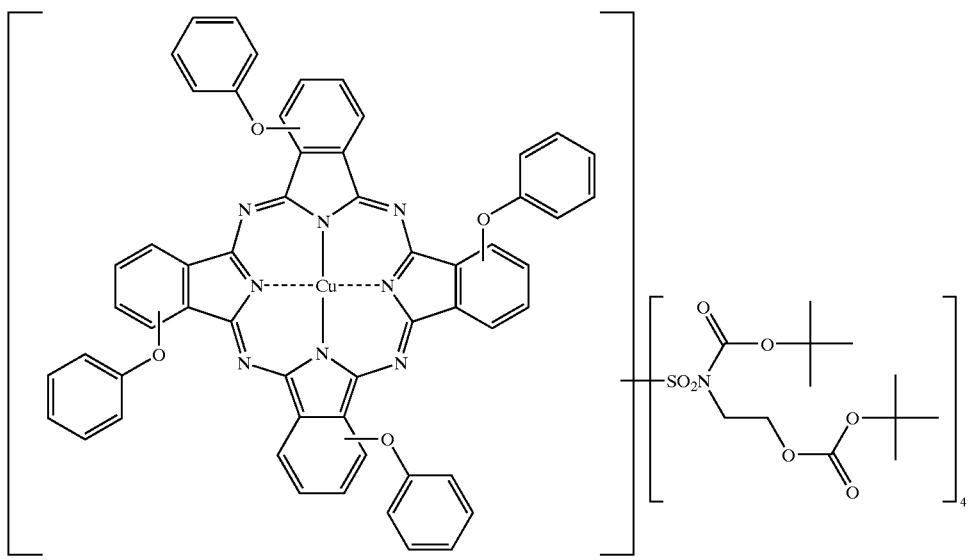

UV/VIS (CH$_2$Cl$_2$): $\lambda_{max}$=725 nm ($\epsilon$=59 507).

Thermogravimetric analysis (0–400° C., 10° C./min.): maximum at 176° C.

EXAMPLE B11

Analogously to Example B10 there is obtained from the product according to Example A12 the product having the following structure:

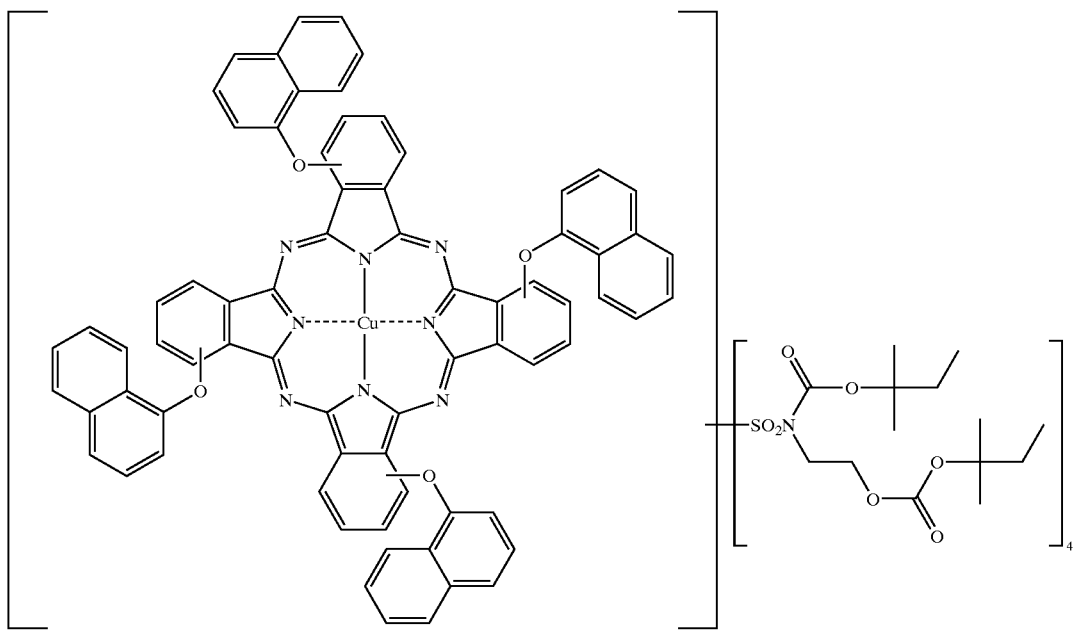

UV/VIS (CH$_2$Cl$_2$): $\lambda_{max}$=715 mm ($\epsilon$=32 644).

Thermogravimetric analysis (0–400° C., 10° C./min.): maximum at 185° C.

EXAMPLE B12

Analogously to Example B10 there is obtained from the product according to Example A13 the corresponding thioether.

EXAMPLE B13

Analogously to Example B11 there is obtained from the product according to Example A14 the corresponding thioether.

EXAMPLE B14

Analogously to Example B8 there is obtained in good yield, using di-tert-amyl pyrocarbonate, the product having the following structure:

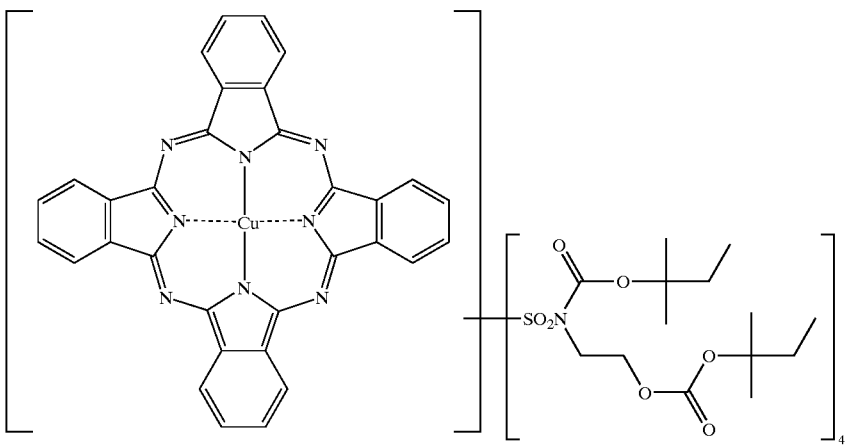

UV/VIS ($CH_2Cl_2$): $\lambda_{max}$=672 nm ($\epsilon$=110 205).

Thermogravimetric analysis (0–400° C., 10° C./min.): maximum at 177° C.

EXAMPLE B15

Analogously to Example B8 there is obtained in good yield from the product according to Example A8 the product having the following structure:

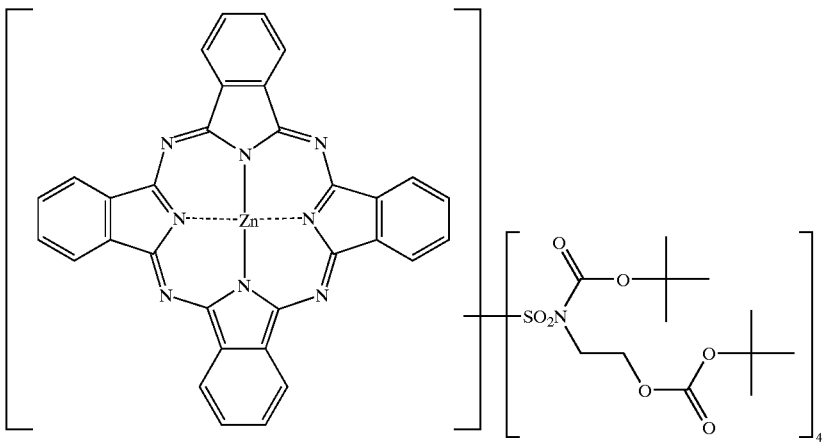

| Analysis [%]: ($C_{80}H_{100}N_{12}O_{28}S_4Zn$) | | | | | |
|---|---|---|---|---|---|
| theory | C 50.86 | H 5.44 | N 8.90 | S 6.79 | Zn 3.46 $H_2O$ 0.94 |
| found | C 51.51 | H 5.19 | N 10.06 | S 6.79 | Zn 3.02 $H_2O$ 0.94. |

UV/VIS ($CH_2Cl_2$): $\lambda_{max}$=674 nm ($\epsilon$=152 876).

Thermogravimetric analysis (0–400° C., 10° C./min.): maximum at 177° C.

EXAMPLE C1

A formulation is prepared by dissolving 1.24 g of ™PHM-C Resin (Maruka Lyncur, $M_w$=5300), 0.25 g of ™Cymel 300 (Cyanamid, distilled twice), 0.055 g of ™Triazine A (Produits Chimiques Auxiliaires et de Synthèse, Longjumeau, France) and 0.5 g of the solubilised pigment according to Example B1 in 7.5 g of cyclopentanone (™OMM HTR-2D, Olin Micro-electronic Materials, Zwijndrecht, Belgium). After filtration through a 1.0 μm filter, the solution is applied by centrifugation at a speed of 1000 revolutions per minute to a glass plate (Corning Type 1737) having a size of 3.81×3.81 cm and then dried on a heating plate at 100° C. for 2 minutes. The layer thickness is approximately 1.5 μm. The film is irradiated image-wise through a mask by means of a ™UXM-502 MD lamp (500 W, Ushio) for 66.7 s (=100 mJ/cm$^2$) and then heated on a heating plate for 2 minutes at 100° C. It is then developed for 25 s using an aqueous solution comprising 2.38% by weight tetramethylammonium hydroxide and 1% by weight Tritone® X-100 (Fluka Chemie AG, Buchs, Switzerland), the previously irradiated areas of the film remaining but the unirradiated areas being dissolved away. Finally, the structured glass plate is rinsed with water for 2 mintues, air-dried and heated at 200° C. for 5 minutes. Patterned film structures of a deep blue colour are obtained. The colour coordinates, measured using a standard F10 light source, are: x=0.209; y=0.326; Y=46.5%.

EXAMPLE C2

A formulation is prepared by dissolving 0.25 g of ™PHM-C Resin (Maruka Lyncur, $M_w$=5300), 0.06 g of ™Cymel 300 (Cyanamid, distilled twice), 0.01 g of ™Triazine A (Produits Chimiques Auxiliaires et de Synthèse, Longjumeau, France) and 0.10 g of the solubilised pigment according to Example B6 in 0.95 g of cyclopentanone (™OMM HTR-2D, Olin Micro-electronic Materials, Zwijndrecht, Belgium). After filtration through a 0.45 μm filter, the solution is applied by centrifugation at a speed of 1000 revolutions per minute to a glass plate (Corning Type 1737) having a size of 3.81×3.81 cm and then dried on a heating plate at 100° C. for one minute. The layer has an absorption maximum ($\lambda_{max}$) at 669 nm. After 5 minutes at 200° C., the absorption maximum ($\lambda_{max}$) is at 662 nm.

What is claimed is:

1. A compound of formula

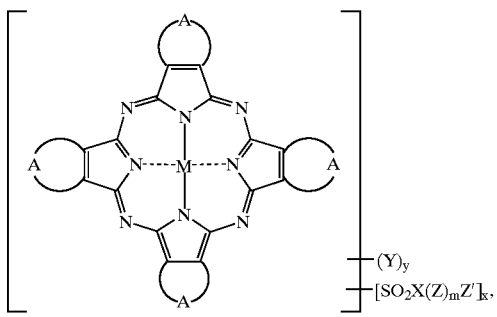

(I)

wherein

M is a divalent metal, oxo metal, halogenometal or hydroxymetal, or 2 hydrogen atoms, A is a radical

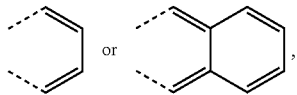

which may be unsubstituted or substituted by phenoxy, naphthyloxy, phenylthio or by naphthylthio, X is a hetero atom selected from the group consisting of N, O and S, m being the number 0 when X is O or S and the number 1 when X is N, Y is Cl or Br, Z is hydrogen, Z' or COOB, Z' is $C_2$–$C_{12}$alkylene-N(COOB)$_2$, $C_2$–$C_{12}$alkylene-NHCOOB, $C_2$–$C_{12}$alkylene-OCOOB or $C_2$–$C_{12}$alkylene-SCOOB, x is a number from 1 to 4, and y is a number from 0 to 15, wherein the sum of x and y is a maximum of 16 and, optionally, a plurality of radicals X, Y, Z and/or Z' may be identical or different, and B is a group of the formula

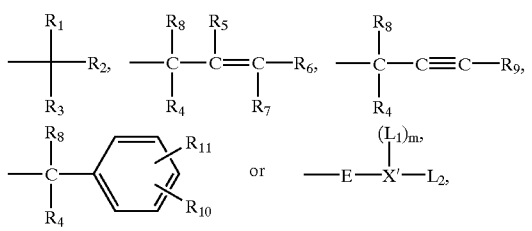

wherein $R_1$ is hydrogen or $C_1$–$C_6$alkyl, $R_2$ and $R_3$ are each independently of the other $C_1$–$C_6$alkyl, $R_4$ and $R_8$ are each independently of the other $C_1$–$C_6$alkyl, $C_1$–$C_6$alkyl interrupted by O, S or by $NR_{12}$, phenyl or biphenyl unsubstituted or substituted by $C_1$–$C_6$alkyl, $C_1$–$C_6$alkoxy, halogen, cyano or by nitro, $R_5$, $R_6$ and $R_7$ are each independently of the others hydrogen or $C_1$–$C_6$alkyl, $R_9$ is hydrogen, $C_1$–$C_6$alkyl or a group of the formula

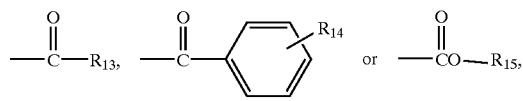

$R_{10}$ and $R_{11}$ are each independently of the other hydrogen, $C_1$–$C_6$alkyl, $C_1$–$C_6$alkoxy, halogen, cyano, nitro, $N(R_{12})_2$, or phenyl unsubstituted or substituted by halogen, cyano, nitro, $C_1$–$C_6$alkyl or by $C_1$–$C_6$alkoxy, $R_{12}$ and $R_{13}$ are each $C_1$–$C_6$alkyl, $R_{14}$ is hydrogen or $C_1$–$C_6$alkyl and $R_{15}$ is $C_1$–$C_6$alkyl, or phenyl unsubstituted or substituted by $C_1$–$C_6$alkyl, E is p,q-$C_2$–$C_6$alkylene unsubstituted or mono- or poly-substituted by $C_1$–$C_6$alkoxy, $C_1$–$C_6$alkythio or by $C_2$–$C_{12}$dialkylamino, wherein p and q are different position numbers, X' is a hetero atom selected from the group consisting of N, O and S, m' being the number 0 when X' is O or S and the number 1 when X' is N, and $L_1$ and $L_2$ are each independently of the other $C_1$–$C_6$alkyl or [—(p',q'-$C_2$–$C_6$alkylene)—Z"—]$_n$-$C_1$–$C_6$alkyl unsubstituted or mono- or poly-substituted by $C_1$–$C_6$alkoxy, $C_1$–$C_6$alkylthio, $C_2$–$C_{12}$dialkylamino, $C_6$–$C_{12}$aryloxy, $C_6$–$C_{12}$arylthio, $C_7$–$C_{18}$arylalkylamino or by $C_{12}$–$C_{24}$diarylamino, wherein n is a number from 1 to 1000 and p' and q' are different position numbers, each Z" independently of the other(s) is a hetero atom O, S or $C_1$–$C_{12}$alkyl-substituted N, and the $C_2$–$C_6$alkylene radicals in the repeating units [—$C_2$–$C_6$alkylene—Z"—] may be identical or different, and $L_1$ and $L_2$ may be saturated or unsaturated from one to ten times, may be uninterrupted or interrupted at any positions by from 1 to 10 groups selected from the group consisting of —(C=O)— and —$C_6H_4$—, and may carry no further substituents or from 1 to 10 further substituents selected from the group consisting of halogen, cyano and nitro.

2. A compound according to claim 1 of formula

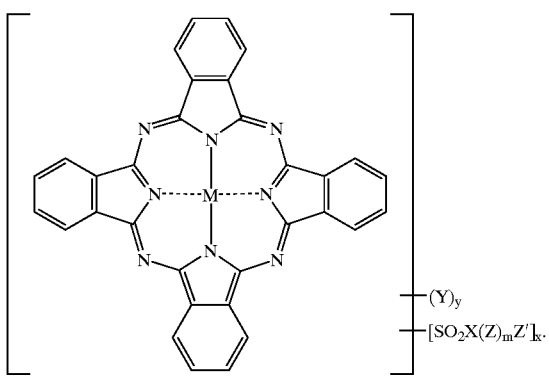

(II)

3. A compound according to claim 1, wherein M is Cu, Pd, Pb, Co, Ni, Zn, Mn or V(=O).

4. A compound according to claim 1, wherein X is N or O and Z' is $C_2-C_{12}$alkylene-NHCOOB or $C_2-C_{12}$alkylene-OCOOB.

5. A compound according to claim 1, wherein X is N, Z is COOB and Z' is $C_2-C_{12}$alkylene-OCOOB.

6. A compound according to claim 1, wherein Z' is $C_2-C_6$alkylene-N(COOB)$_2$, $C_2-C_6$alkylene-NHCOOB, $C_2-C_6$alkylene-OCOOB or $C_2-C_6$alkylene-SCOOB.

7. A compound according to claim 1, wherein B is

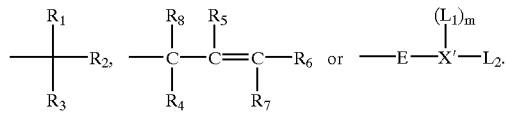

* * * * *